US010026795B2

(12) United States Patent
Abe et al.

(10) Patent No.: US 10,026,795 B2
(45) Date of Patent: Jul. 17, 2018

(54) ORGANIC EL ELEMENT AND METHOD FOR MANUFACTURING ORGANIC EL ELEMENT

(71) Applicant: JOLED INC., Tokyo (JP)

(72) Inventors: Yuuki Abe, Tokyo (JP); Kazuhiro Yokota, Tokyo (JP); Yasuharu Shinokawa, Tokyo (JP); Kou Sugano, Osaka (JP); Eiji Takeda, Osaka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/312,183

(22) PCT Filed: May 20, 2015

(86) PCT No.: PCT/JP2015/002533
§ 371 (c)(1),
(2) Date: Nov. 18, 2016

(87) PCT Pub. No.: WO2015/178021
PCT Pub. Date: Nov. 26, 2015

(65) Prior Publication Data
US 2017/0092710 A1    Mar. 30, 2017

(30) Foreign Application Priority Data

May 21, 2014 (JP) .................................. 2014-104991

(51) Int. Cl.
*H01L 29/08* (2006.01)
*H01L 51/00* (2006.01)
(Continued)

(52) U.S. Cl.
CPC ...... *H01L 27/3262* (2013.01); *H01L 27/3244* (2013.01); *H01L 51/5206* (2013.01);
(Continued)

(58) Field of Classification Search
CPC ........................ H01L 27/3244; H01L 51/5206
(Continued)

(56) References Cited

U.S. PATENT DOCUMENTS 5,443,922 A      8/1995 Nishizaki et al.
2006/0049753 A1*  3/2006 Kang ...................... H01L 51/56
                                                    313/506
(Continued)

FOREIGN PATENT DOCUMENTS

JP        5-163488 A     6/1993
JP     2010-244868 A    10/2010
(Continued)

OTHER PUBLICATIONS

International Search Report in PCT/JP2015/002533, dated Jul. 14, 2015.

*Primary Examiner* — Robert Huber
(74) *Attorney, Agent, or Firm* — Hauptman Ham, LLP

(57) ABSTRACT

An organic EL element including: a TFT substrate having a TAOS-TFT; and an organic EL unit having a lower electrode. The lower electrode includes an aluminum containing metal layer, a transition metal containing oxide layer disposed between the aluminum containing metal layer and the TFT substrate, and an aluminum containing oxide layer disposed between the aluminum containing metal layer and the transition metal containing oxide layer and in contact with both the aluminum containing metal layer and the transition metal containing oxide layer. The aluminum containing oxide layer contains aluminum oxide. The transition metal containing oxide layer contains tungsten oxide and has a density of 6.5 g/cm³ or more.

2 Claims, 10 Drawing Sheets

(51) Int. Cl.
  *H01L 27/32* (2006.01)
  *H01L 51/52* (2006.01)
  H01L 27/12 (2006.01)
  H01L 29/786 (2006.01)

(52) U.S. Cl.
  CPC .... *H01L 27/1225* (2013.01); *H01L 29/78606* (2013.01); *H01L 29/78693* (2013.01); *H01L 2227/323* (2013.01)

(58) Field of Classification Search
  USPC .......................................... 257/40, E51.019
  See application file for complete search history.

(56) References Cited

U.S. PATENT DOCUMENTS

| | | |
|---|---|---|
| 2008/0258612 A1 | 10/2008 | Kim et al. |
| 2010/0253214 A1 | 10/2010 | Imai et al. |
| 2011/0297944 A1* | 12/2011 | Choi ............... H01L 27/124 257/59 |
| 2012/0104396 A1* | 5/2012 | Pyo ............... H01L 27/124 257/59 |
| 2014/0159026 A1 | 6/2014 | Okumoto et al. |
| 2014/0312336 A1 | 10/2014 | Abe et al. |

FOREIGN PATENT DOCUMENTS

| | | |
|---|---|---|
| JP | 2012-43815 A | 3/2012 |
| JP | 2014-2983 A | 1/2014 |
| JP | 2014-82169 A | 5/2014 |
| WO | 2013/069274 A1 | 5/2013 |
| WO | 2013/183289 A1 | 12/2013 |

\* cited by examiner

ORGANIC EL ELEMENT AND METHOD FOR MANUFACTURING ORGANIC EL ELEMENT

RELATED APPLICATIONS

The present application is a National Phase of International Application Number PCT/JP2015/002533, filed on May 20, 2015, which claims priority to Japanese Patent Application Number 2014-104991, filed on May 21, 2014.

TECHNICAL FIELD

The present invention relates to an organic electroluminescence (EL) element including a TAOS-TFT as a driving transistor.

BACKGROUND ART

An organic EL element is a light-emitting element that makes use of an electroluminescent phenomenon of an organic material. A typical organic EL element has a thin film transistor (TFT) substrate and an organic EL unit disposed on the TFT substrate. The organic EL unit has an organic light-emitting layer disposed between a lower electrode and an upper electrode. The TFT substrate has a TFT that is electrically connected to the lower electrode and that serves as a driving transistor controlling light emission from the organic EL unit (for example, Patent Literature 1).

In recent years, a transparent amorphous oxide semiconductor (TAOS) is used for TFT channel layers of organic EL elements so as to enable the organic EL elements to drive at high speed (A TFT having a channel layer made of TAOS is hereinafter referred to as "TAOS-TFT").

CITATION LIST

Patent Literature

Patent Literature 1

SUMMARY OF INVENTION

Technical Problem

However, it is known that hydrogenation of TAOS in a TFT results in a decrease in TFT carrier mobility and a deterioration of TFT properties. In connection with this, it should be noted that hydrogen is sometimes generated during manufacture of an organic EL unit of an organic EL element. Thus, for an organic EL element including a TAOS-TFT, a countermeasure needs to be taken against hydrogen that may be generated during the manufacture of the organic EL unit.

The present invention has been achieved in view of the above problems, and an aim thereof is to provide an organic EL element that includes a TAOS-TFT and has high resistance against hydrogen generated during manufacture of the organic EL unit, and a manufacturing method of such an organic EL element.

Solution to Problem

In order to solve the above problems, one aspect of the present invention is an organic EL element including: a substrate including a thin film transistor (TFT); and an organic EL unit including an electrode electrically connected to the TFT. IN the organic EL element, the TFT has a channel layer made of a transparent amorphous oxide semiconductor (TAOS), the electrode is a stack of a plurality of layers disposed on the substrate, the plurality of layers include: a metal layer made of aluminum or an alloy containing aluminum; a first oxide layer closer to the substrate than the metal layer; and a second oxide layer disposed between the metal layer and the first oxide layer and in contact with both the metal layer and the first oxide layer, the second oxide layer contains an oxide of aluminum, and the first oxide layer contains an oxide of a transition metal.

Advantageous Effects of Invention

In the organic EL element pertaining to the one aspect, the second oxide layer is made of aluminum oxide, which blocks hydrogen. Thus, the second oxide layer prevents hydrogen generated at the metal layer from moving toward the substrate. As a result, the risk is reduced of the TAOS in the channel layer undergoing hydrogenation due to hydrogen generated during manufacture of the organic EL unit. Accordingly, the organic EL element includes a TAOS-TFT as a driving transistor and has high resistance against hydrogen generated during manufacture of the organic EL unit.

BRIEF DESCRIPTION OF DRAWINGS

FIG. 2A illustrates a state in which a TFT substrate has been formed. FIG. 2B illustrates a state in which a transition metal material layer has been formed on the TFT substrate. FIG. 2C illustrates a state in which a transition metal oxide material layer has been formed on the transition metal material layer. FIG. 2D illustrates a state in which an aluminum oxide material layer has been formed on the transition metal oxide material layer. FIG. 2E illustrates a state in which an aluminum material layer has been formed on the aluminum oxide material layer. FIG. 2F illustrates a state in which the forming of the lower electrode has been completed.

FIG. 10A illustrates a relationship between power and normalized carrier lifetime values, FIG. 10B illustrates a relationship between gas pressure and normalized carrier lifetime values, and FIG. 10C illustrates a relationship between oxygen concentration and normalized carrier lifetime values.

Figure 1:
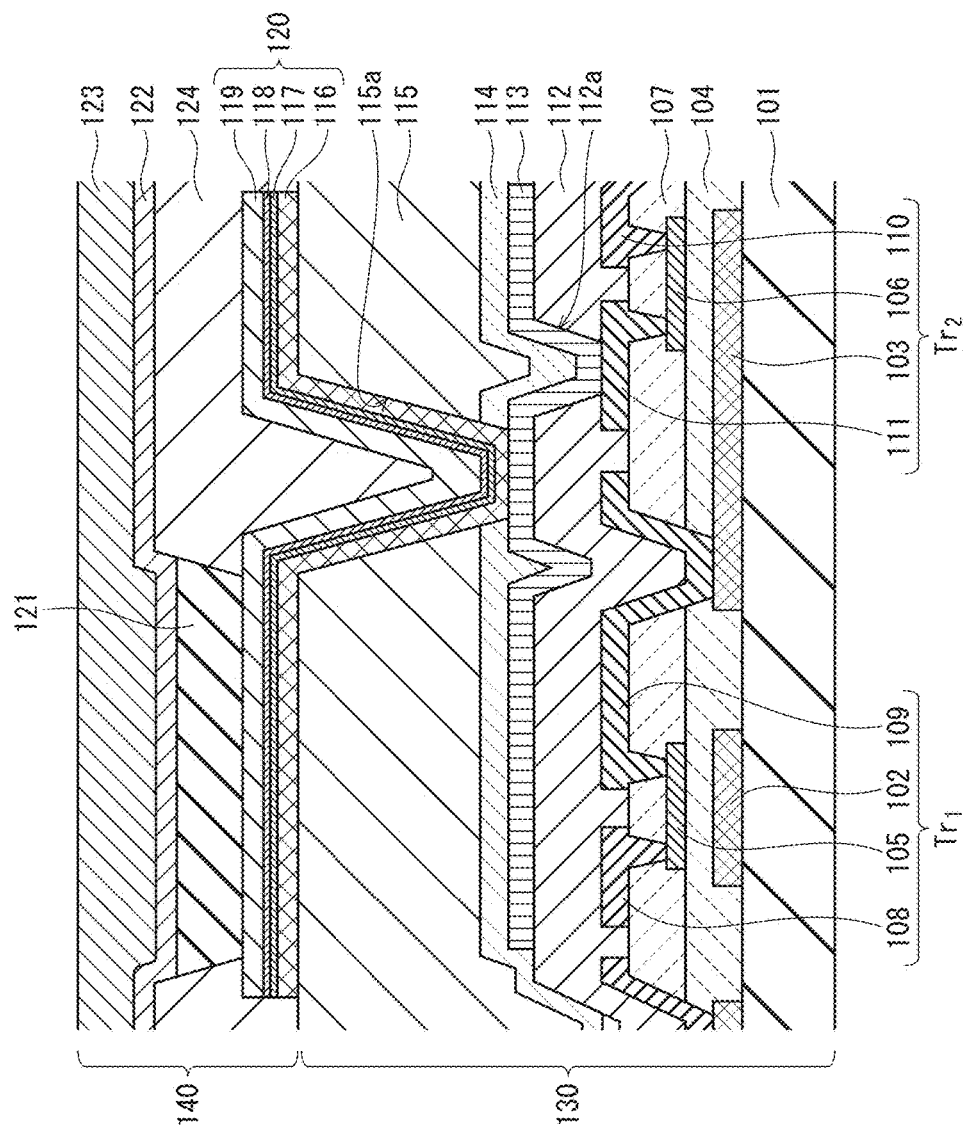
FIG. 1 is a partial cross-sectional view illustrating an overall structure of an organic EL element pertaining to one aspect of the present invention.

DESCRIPTION OF EMBODIMENTS (Circumstances Leading to Aspects of Present Invention)

As described above, an organic EL element including a TAOS-TFT may be affected by hydrogen generated during manufacture of the organic EL unit. In connection with this, the inventors of the present invention have found that the use of aluminum or an aluminum alloy as an electrode material in the organic EL unit leads to a notable decrease in carrier mobility in the TAOS-TFT.

The inventors considered that this is a result of hydrogen (which is used as a term encompassing both hydrogen and hydrogen radicals in the present disclosure) being generated upon baking of the aluminum or aluminum alloy. This baking is performed when forming an electrode of an organic EL unit by performing sputtering using aluminum or an aluminum alloy, to reduce electrical resistance. The inventors assumed that TAOS in the TAOS-TFT undergoes hydrogenation due to hydrogen generated from the electrode during this baking.

From the above, the inventors of the present invention have arrived at the aspects of the present invention described in the following.

That is, a first aspect of the present invention is an organic EL element including: a substrate including a thin film transistor (TFT); and an organic EL unit including an electrode electrically connected to the TFT. In the organic EL element, the TFT has a channel layer made of a transparent amorphous oxide semiconductor (TAOS), the electrode is a stack of a plurality of layers disposed on the substrate, the plurality of layers include: a metal layer made of aluminum or an alloy containing aluminum; a first oxide layer closer to the substrate than the metal layer; and a second oxide layer disposed between the metal layer and the first oxide layer and in contact with both the metal layer and the first oxide layer, the second oxide layer contains an oxide of aluminum, and the first oxide layer contains an oxide of a transition metal.

In the organic EL element pertaining to the first aspect, the second oxide layer is made of aluminum oxide, which blocks hydrogen, and is disposed to be in contact with a surface of the metal layer facing the substrate. Thus, the second oxide layer prevents hydrogen generated at the metal layer from moving toward the substrate. In other words, even when hydrogen is generated from the metal layer during the baking performed to reduce electrical resistance, the second oxide layer protects the substrate from the generated hydrogen. As a result, the risk is reduced of the TAOS channel layer undergoing hydrogenation due to hydrogen generated during baking of the metal layer. Accordingly, the organic EL element includes a TAOS-TFT as a driving transistor and has high resistance against hydrogen generated during manufacture of the organic EL unit. Note that in the following, the extent to which hydrogen generated during manufacture of an organic EL unit affects an organic EL element is referred to as the resistance of the organic EL element against hydrogen generated during manufacture of the organic EL unit.

For example, a second aspect of the present invention may be the first aspect in which a thickness of the second oxide layer is in an inclusive range from 2 nm to 3 nm.

When the thickness of the second oxide layer is in the inclusive range from 2 nm to 3 nm, the second oxide layer conducts electricity when quantum tunnelling occurs or when electrical insulation breaks down due to driving voltage of the organic EL unit. Thus, the second aspect ensures that the organic EL unit receives current from the TFT.

For example, a third aspect of the present invention may be the first aspect in which the transition metal is tungsten, and a density of the first oxide layer is 6.5 g/cm$^3$ or more.

The inventors have confirmed through experiments that when the first oxide layer includes tungsten oxide, the effect of the hydrogen generated during the manufacture of the organic EL unit can be sufficiently suppressed by providing the first oxide layer with a density of 6.5 g/cm$^3$ or more.

A fourth aspect of the present invention is a manufacturing method of an organic EL element including: preparing a substrate including a TFT including a TAOS as a channel layer; forming an oxide material layer containing an oxide of a transition metal on the substrate; and forming an aluminum material layer made of aluminum or an alloy containing aluminum on the oxide material layer.

The inventors have confirmed that aluminum disposed in contact with the oxide material layer, which contains a transition metal oxide, undergoes oxidization at a surface thereof in contact with the oxide material layer. Further, the inventors have confirmed that the same occurs with an aluminum alloy.

In the manufacturing method pertaining to the fourth aspect, the aluminum material layer is formed on the oxide material layer. This results in the aluminum or aluminum alloy constituting the aluminum material layer undergoing oxidization (i.e., forming of an aluminum oxide layer) at a surface of the aluminum material layer in contact with the oxide material layer. This aluminum oxide layer prevents hydrogen generated at the aluminum material layer from moving toward the oxide material layer. As a result, the TAOS channel layer is prevented from undergoing hydrogenation due to hydrogen generated from the aluminum material layer during baking. Accordingly, the manufacturing method yields an organic EL element that includes a TAOS-TFT as a driving transistor and has high resistance against hydrogen generated during manufacture of the organic EL unit.

For example, a fifth aspect of the present invention may be the fourth aspect in which the oxide material layer is formed through disposing a metal material layer made of a transition metal or an alloy of a transition metal on the substrate and oxidizing a surface of the metal material layer through baking.

In the manufacturing method pertaining to the fifth aspect, the oxide material layer is formed.

For example, a sixth aspect of the present invention may be the fourth aspect in which the transition metal is tungsten, and a density of the oxide material layer is 6.5 g/cm$^3$ or more.

In the manufacturing method pertaining to the sixth aspect, when the sputter particles come in contact with a surface of the oxide material layer in the sputtering, the sputter particles, due to having high energy, easily deoxidizes the transition metal oxide in the oxide material layer.

For example, a seventh aspect of the present invention may be the fourth aspect in which the aluminum material layer is formed through sputtering a target material made of aluminum or an alloy containing aluminum and causing sputter particles to adhere onto the oxide material layer.

The inventors have confirmed through experiments that forming an oxide material layer containing tungsten oxide to have a density of 6.5 g/cm$^3$ or more yields an organic EL element with satisfactory resistance against hydrogen generated during the manufacture of the organic EL unit.

The following describes an embodiment of an organic EL element pertaining to the above-described aspects of the present invention, with reference to the drawings.

Embodiment

Structure of Organic EL Element

FIG. 1 is a partial cross-sectional view illustrating an overall structure of an organic EL element pertaining to one aspect of the present invention. As illustrated in FIG. 1, the organic EL element pertaining to the present aspect is a top-emission type organic EL element including a TFT substrate 130 and an organic EL unit 140 disposed on the TFT substrate 130.

TFT Substrate 130

The TFT substrate 130 is a substrate of the organic EL element pertaining to the present aspect. The TFT substrate 130 includes a substrate 101 and a driving circuit for driving the organic EL unit 140 disposed on the substrate 101.

The substrate 101 is made of an inorganic material or an organic material. Examples of a material for the substrate 101 include an electrically-insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina. Further, an organic resin film can be used.

Gate electrodes 102 and 103 that are spaced away from each other are disposed on the substrate 101. For example, the gate electrodes 102 and 103 are made of an alloy of silver, palladium, and copper, an alloy of silver, rubidium, and gold, an alloy of molybdenum and chromium (MoCr), an alloy of nickel and chromium (NiCr), aluminum, an aluminum alloy, indium tin oxide (ITO), indium zinc oxide (IZO), copper, or molybdenum.

A gate insulating layer 104 is disposed to cover surfaces of the gate electrodes 102 and 103 and the substrate 101. The gate insulating layer 104 is made of a known gate insulating material such as silicon oxide (SiO).

A TAOS channel layer 105 is disposed on a portion of the gate insulating layer 104 corresponding to the gate electrode 102. Further, a TAOS channel layer 106 is disposed on a portion of the gate insulating layer 104 corresponding to the gate electrode 103. The TAOS channel layers 105 and 106 are channel layers of the organic EL element pertaining to the present aspect and are made of TAOS such as a-InGaZnO4.

A channel protection layer 107 is disposed to cover surfaces of the TAOS channel layers 105 and 106 and the gate insulating layer 104.

Drain electrodes 108 and 110 and source electrodes 109 and 111 are formed on the channel protection layer 107. The drain electrode 108 and the source electrode 109 are connected to the TAOS channel layer 105 in a contact hole penetrating through the channel protection layer 107. Further, the drain electrode 110 and the source electrode 111 are connected to the TAOS channel layer 106 in a contact hole penetrating through the channel protection layer 107. The drain electrodes 108 and 110 and the source electrodes 109 and 111 are made of molybdenum, tungsten, molybdenum tungsten, vanadium, ruthenium, gold, or copper.

A lower passivation layer 112 is disposed to cover the drain electrodes 108 and 110, the source electrodes 109 and 111, and the channel protection layer 107. The lower passivation layer 112 is made of an inorganic material such as silicon oxide (SiO). The lower passivation layer 112 has a contact hole 112a above the source electrode 111.

A connection electrode 113 is disposed to extend along side walls of the contact hole 112a. A lower portion of the connection electrode 113 connects to the source electrode 111, and a part of an upper portion of the connection electrode 113 is present on the lower passivation layer 112. The connection electrode 113 may be made of the same material as the source electrode 111.

An upper passivation layer 114 is disposed to cover surfaces of the connection electrode 113 and the lower passivation layer 112. An interlayer electrically-insulating layer 115 is disposed, through deposition, on the upper passivation layer 114. The interlayer electrically-insulating layer 115 is made of an electrically-insulating material such as a polyimide resin or an acrylic resin.

A contact hole 115a is disposed to penetrate through the upper passivation layer 114 and the interlayer electrically-insulating layer 115. The inside of the contact hole 115a exposes the connection electrode 113.

In the TFT substrate 130 having the structure described above, the gate electrode 102, the gate insulating layer 104, the TAOS channel layer 105, the drain electrode 108, and the source electrode 109 constitute a TFT Tr1. Further, the gate electrode 103, the gate insulating layer 104, the TAOS channel layer 106, the drain electrode 110, and the source electrode 111 constitutes a TFT Tr2. In the TFT substrate 130, the TFT Tr1 serves as a selection transistor, and the TFT Tr2 serves as a driving transistor.

Organic EL Unit 140

The organic EL unit 140 includes a lower electrode 120 disposed on the interlayer electrically-insulating layer 115.

The lower electrode 120 includes, layered one on top of another in the stated order, a transition metal containing metal layer 116, a transition metal containing oxide layer 117, an aluminum containing oxide layer 118, and an aluminum containing metal layer 119.

The transition metal containing metal layer 116 connects to the connection electrode 113 in the contact hole 115a. The transition metal containing metal layer 116 is made of a metal containing a transition metal element such as tungsten, molybdenum, or iron, or an alloy containing such a transition metal element.

The transition metal containing oxide layer 117 covers the surface of the transition metal containing metal layer 116.

The transition metal containing oxide layer 117 is a first oxide layer of the organic EL element pertaining to the present aspect, and is made of an oxide of a metal containing a transition metal element such as tungsten, molybdenum, or iron or an oxide of an alloy containing such a transition metal element.

The aluminum containing oxide layer 118 covers the surface of the transition metal containing oxide layer 117. The aluminum containing oxide layer 118 is a second oxide layer of the organic EL element pertaining to the present aspect, and is made of an aluminum oxide or an oxide of an aluminum alloy. For example, a preferable thickness of the aluminum containing oxide layer 118 is in an inclusive range from 2 nm to 3 nm. When the thickness of the aluminum containing oxide layer 118 is in this range, the aluminum containing oxide layer 118 conducts electricity when quantum tunnelling occurs or electrical insulation breaks down due to driving voltage of the organic EL unit 140. Thus, with a thickness within the above-described range, the aluminum containing oxide layer 118 does not block the supply of current from the driving transistor to the organic EL unit 140.

The aluminum containing metal layer 119 is disposed to cover the surface of the aluminum containing oxide layer 118. The aluminum containing metal layer 119 is a metal layer of the organic EL element pertaining to the present aspect, and is made of aluminum, which is a light-reflective material, or an aluminum alloy, which is a light-reflective material.

The organic EL unit 140 further includes banks 124 made of an organic material such as acrylic resin, polyimide resin, or novolac type phenolic resin, or an inorganic material such as silicon oxide (SiO) or silicon nitride (SiN).

The organic EL unit 140 further includes an organic light-emitting layer 121 disposed in a region defined by the banks 124. For example, the organic light-emitting layer 121 is made of F8BT (poly(9,9-di-n-octylfluorene-alt-benzothiadiazole)), which is an organic polymer, and emits light by making use of an electroluminescent phenomenon. The organic light-emitting layer 121 is not necessarily made of F8BT, and can be made of a known organic material such as a fluorescent material like an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, an anthracene compound, a cyanine compound, an acridine compound, a metal complex of an 8-hydroxyquinoline compound, a metal complex of a 2-bipyridine compound, a complex of a Schiff base and a group III metal, a metal complex of oxine, or a rare earth metal complex, as described in Japanese Patent Application Publication No. H5-163488. Further, one or more functional layers such as a hole injection layer, a hole transport layer, an electron injection layer, and an electron transport layer may be disposed in the region defined by the banks 124 in addition to the organic light-emitting layer 121.

The organic EL unit 140 further includes an upper electrode 122 disposed to cover the organic light-emitting layer 121 and the banks 124. For example, the upper electrode 122 is made of indium tin oxide (ITO) or indium zinc oxide (IZO). In a top-emission type organic EL element, it is preferable that the upper electrode 122 be made of a light-transmissive material.

The organic EL unit 140 further includes a sealing layer 123 made of silicon nitride (SiN) or silicon oxynitride (SiON), for example. The sealing layer 123 prevents the organic EL unit 140 and the like from being exposed to moisture, air, or the like. In a top-emission type organic EL element, it is preferable that the sealing layer 123 be made of a light-transmissive material.

The organic EL element, which has the structure described above, is characterized in that the aluminum containing oxide layer 118 disposed on the lower surface of the aluminum containing metal layer 119 has a certain level of density. Thus, the aluminum containing oxide layer 118 prevents hydrogen generated at the aluminum containing metal layer 119 during the manufacture of the lower electrode 120 from moving toward the TFT substrate 130.

Manufacturing Method of Organic EL Element

The following describes a manufacturing method of the organic EL element. The manufacturing method pertaining to one aspect of the present invention is characterized in terms of how the lower electrode 120 is formed. Thus, the following description focuses on how the lower electrode 120 is formed. FIG. 2A through FIG. 2F illustrate how the lower electrode 120 is formed.

Figure 2A:
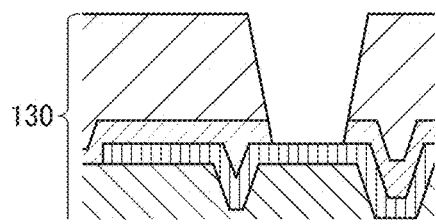
FIG. 2A through FIG. 2F schematically illustrate, among manufacturing processes of the organic EL element pertaining to the present aspect, a process of forming of a lower electrode.

In the forming of the lower electrode 120, the TFT substrate 130 is first prepared as illustrated in FIG. 2A.

Figure 2E:
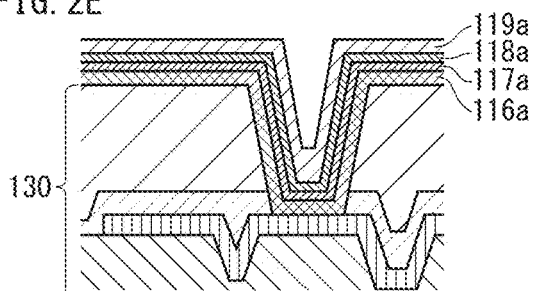
Figure 2B:
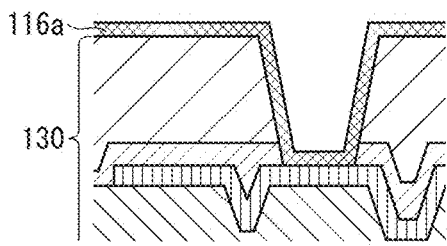

Next, a transition metal material layer 116*a* is uniformly formed on a surface of the TFT substrate 130, as illustrated in FIG. 2B. The transition metal material layer 116*a* is a metal material layer in the manufacturing method pertaining to the present aspect, and is made of a metal including a transition metal element or an alloy including a transition metal element. For example, the transition metal material layer 116*a* can be formed through sputtering. The sputtering is performed, for example, by using a flat plate made of a metal containing a transition metal element or an alloy containing a transition metal element as the target material, and by using argon gas as the inert gas.

Figure 2F:
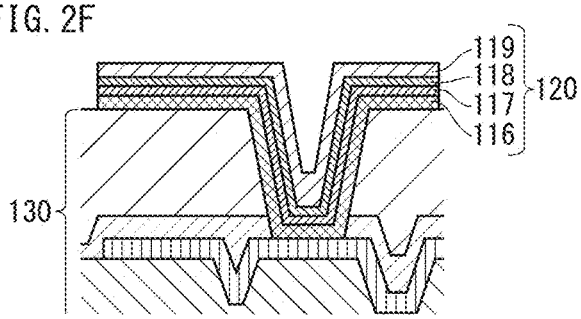
Figure 2C:
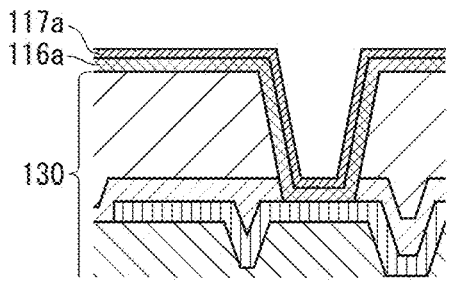

Next, a transition metal oxide material layer 117*a* is uniformly formed on a surface of the transition metal material layer 116*a*, as illustrated in FIG. 2C. The transition metal oxide material layer 117*a* is an oxide material layer in the manufacturing method pertaining to the present aspect, and is made of an oxide of a metal containing a transition metal element or an oxide of an alloy containing a transition metal element. For example, the transition metal oxide material layer 117*a* can be formed through baking. The baking is performed, for example, by baking the transition metal material layer 116*a* at a temperature of 230° C. in an air atmosphere and thereby oxidizing the surface of the transition metal material layer 116*a*.

Figure 2D:
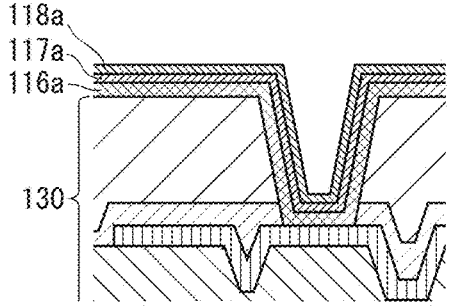

Next, an aluminum oxide material layer 118*a* is uniformly formed on the surface of the transition metal oxide material layer 117*a*, as illustrated in FIG. 2D. The aluminum oxide material layer 118*a* is made of aluminum oxide or an oxide of an aluminum alloy. For example, the aluminum oxide material layer 118*a* can be formed through sputtering. The sputtering is performed, for example, by using a flat plate made of aluminum or an aluminum alloy as the target material, and by using argon gas as the inert gas.

Figure 3C:
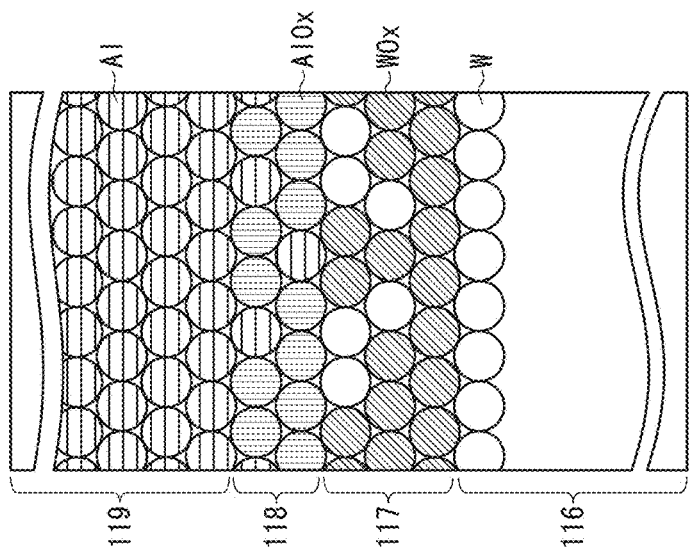
FIG. 3A, FIG. 3B, and FIG. 3C are schematic views describing a phenomeon that takes place when sputtering is performed using aluminum or an alloy of aluminum as a target material.
Figure 3B:
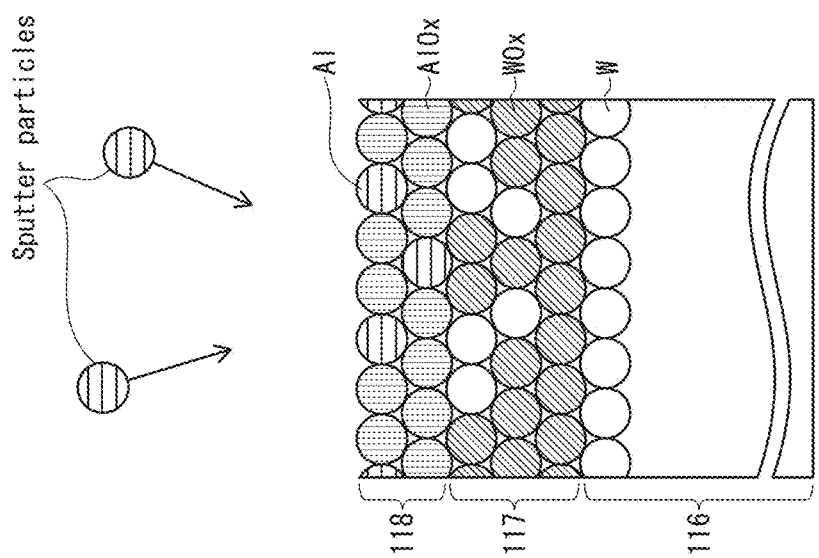
Figure 3A:
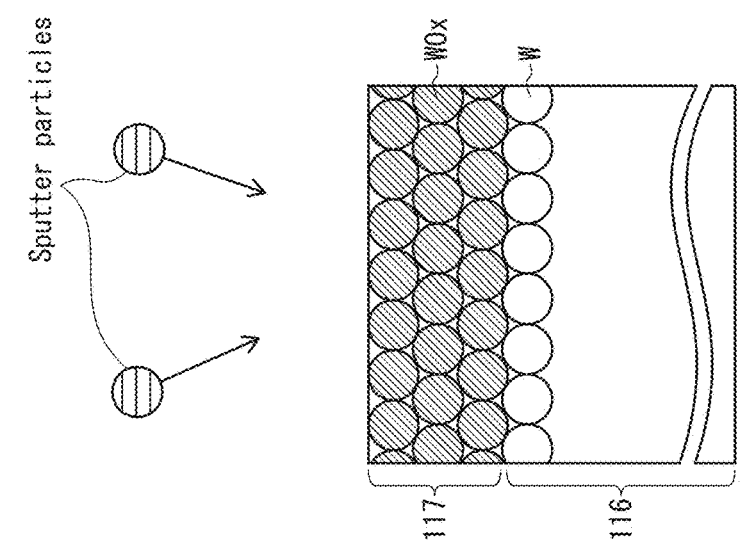

The following describes a phenomenon that takes place during the forming of the aluminum oxide material layer 118*a*, with reference to FIG. 3A and FIG. 3B. FIG. 3A and FIG. 3B illustrates an example where the transition metal material layer 116*a* and the transition metal oxide material layer 117*a* contain tungsten (W) as a transition metal element.

As illustrated in FIG. 3A, sputter particles having high energy collide with a surface of the transition metal oxide material layer 117a during the forming of the aluminum oxide material layer 118a. Transition metal elements such as tungsten can have a plurality of different atomic values, and therefore can have a plurality of different oxidized states. Because of this property of transition metal elements, an oxide of a transition metal can become a source of oxygen atoms by changing from an oxidized state with a large oxidation number to an oxidized state with a small oxidation number. Therefore, aluminum in the sputter particles colliding with the transition metal oxide material layer 117a undergoes oxidization by depriving the tungsten oxide contained in the transition metal oxide material layer 117a of some oxygen atoms, as illustrated in FIG. 3B. This phenomenon continues to take place until the thickness of the aluminum oxide material layer 118a reaches a thickness within an inclusive range from 2 nm to 3 nm.

Next, an aluminum material layer 119a is uniformly formed on a surface of the aluminum oxide material layer 118a, as illustrated in FIG. 2E. The aluminum material layer 119a is made of aluminum or an aluminum alloy. The aluminum material layer 119a can be formed by continuing the sputtering for forming the aluminum oxide material layer 118a even after the aluminum oxide material layer 118a has been formed.

The following describes a phenomenon that takes place during the forming of the aluminum material layer 119a, with reference to FIG. 3B and FIG. 3C. After the aluminum oxide material layer 118a has been formed, sputter particles collide with a surface of the aluminum oxide material layer 118a, as illustrated in FIG. 3B. Here, the aluminum oxide material layer 118a has a thickness within the inclusive range from 2 nm to 3 nm as described above. Accordingly, the sputter particles that collide with the surface of the aluminum oxide material layer 118a can no longer deprive the tungsten oxide in the transition metal oxide material layer 117a of oxygen atoms. As a result, the sputter particles are deposited on the aluminum oxide material layer 118a without undergoing oxidization, as illustrated in FIG. 3C.

Through the above-described processes, each of the transition metal material layer 116a, the transition metal oxide material layer 117a, the aluminum oxide material layer 118a, and the aluminum material layer 119a is uniformly disposed on the TFT substrate 130.

Next, baking is performed to reduce the electrical resistance of the aluminum material layer 119a.

During the baking, hydrogen is generated from the aluminum material layer 119a. Specifically, water molecules that have been taken in the aluminum material layer 119a during the forming of the aluminum material layer 119a through sputtering releases hydrogen. Here, the aluminum oxide material layer 118a contains aluminum oxide, which blocks hydrogen. Accordingly, the aluminum oxide material layer 118a prevents hydrogen generated at the aluminum material layer 119a from moving toward the transition metal oxide material layer 117a. As a result, the hydrogen generated at the aluminum material layer 119a is prevented from reaching the TAOS channel layer 105 in the TFT substrate 130.

Next, the forming of the lower electrode 120 on the TFT substrate 130 is completed, as illustrated in FIG. 2F. For example, the forming of the lower electrode 120 can be completed through the following processes. First, a resist layer is formed on the aluminum material layer 119a. Then, a mask having an opening of a predetermined shape is placed on the resist layer, and light is irradiated from above the mask onto the resist layer. Resist residues are then washed away by using a developing solution (such as a tetramethylammonium hydroxide (TMAH) solution). These processes complete patterning of the resist layer. Subsequently, the aluminum material layer 119a and the aluminum oxide material layer 118a are wet-etched in this order by using a wet etchant. The transition metal oxide material layer 117a and the transition metal material layer 116a are then dry-etched in this order. Finally, the resist layer is removed by using, for example, an organic stripping liquid.

The manufacturing method of the organic EL element pertaining to the present aspect, which includes the above-described processes, prevents hydrogen generated during forming the lower electrode 120 from reaching the TAOS channel layer 105 in the TFT substrate 130.

Meanwhile, when the transition metal material layer 116a is formed by using a metal containing tungsten or an alloy containing tungsten as a transition metal element, the transition metal oxide material layer 117a would contain tungsten oxide. In this case, it is preferable that sputtering for forming the aluminum oxide material layer 118a be performed without washing the transition metal oxide material layer 117a formed through baking, to prevent loss of the tungsten oxide, which has high water solubility, due to the washing.

Experiments

Implementation Example 1

Implementation example 1 of the organic EL element pertaining to the present aspect was manufactured according to the above-described manufacturing method, by using the specific target materials described in the following in the sputtering for forming the transition metal material layer 116a, the aluminum oxide material layer 118a, and the aluminum material layer 119a.

Specifically, a flat plate made of tungsten was used as the target material in the sputtering for forming the transition metal material layer 116a.

Further, a flat plate made of an Al—Co based alloy, which is one example of an aluminum alloy, was used as the target material in the sputtering for forming the aluminum oxide material layer 118a and the aluminum material layer 119a.

State of Cross-section of Lower Electrode

Figure 4:
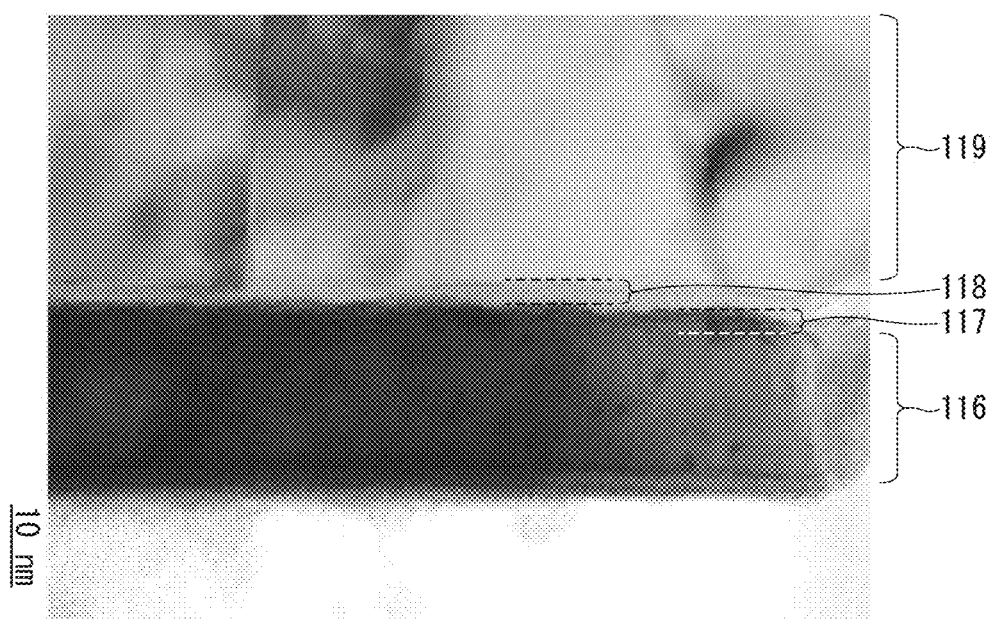
FIG. 4 is an electron microscope photograph showing a cross-section of the lower electrode.

A cross-section of the lower electrode 120 of the organic EL element pertaining to implementation example 1 was observed by using a transmission type electron microscope (TEM). FIG. 4 is an electron microscope photograph showing a state of a cross-section of the lower electrode 120.

As illustrated in FIG. 4, the cross-section includes a white layer between the aluminum containing metal layer 119 made of an Al—Co based alloy and the transition metal containing oxide layer 117 made of tungsten oxide. This shows that the aluminum containing oxide layer 118 was formed so as to be in contact with both the aluminum containing metal layer 119 and the transition metal containing oxide layer 117.

Next, the aluminum containing oxide layer 118 and the transition metal containing oxide layer 117 were analyzed by using an energy-dispersive X-ray spectroscopy (EDS).

Figure 5B:
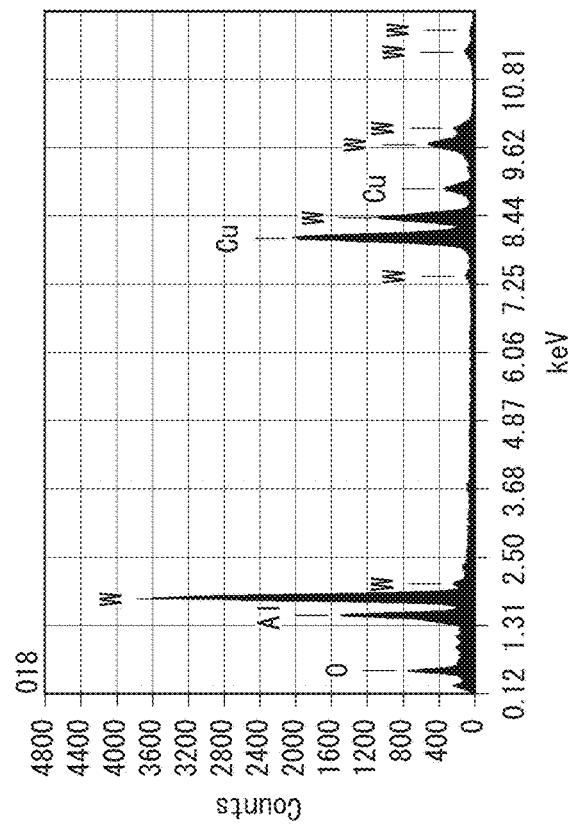
FIG. 5B illustrates a result of an EDS analysis of the transition metal containing oxide layer.
Figure 5A:
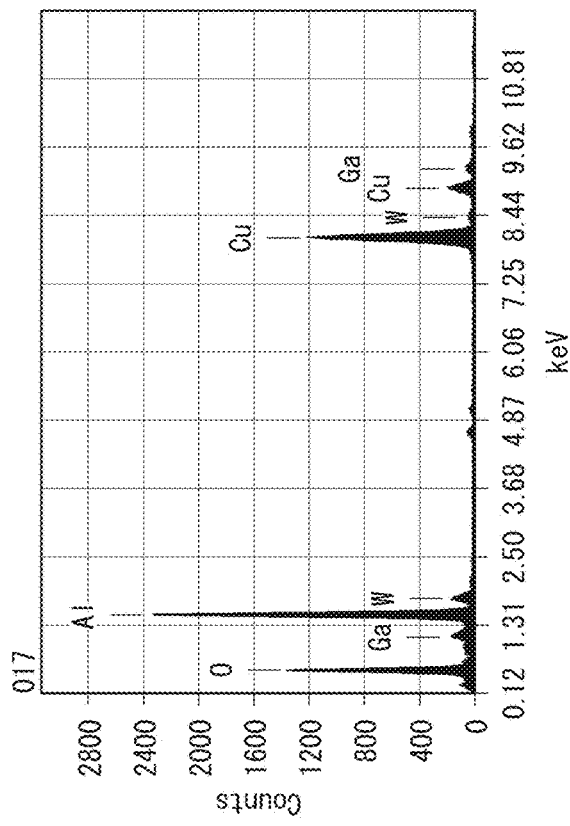
FIG. 5A illustrates a result of an energy-dispersive X-ray spectroscopy (EDS) analysis of the aluminum containing oxide layer.

FIG. 5A illustrates a result of an EDS analysis of the aluminum containing oxide layer 118. As illustrated in FIG. 5A, the aluminum containing oxide layer 118 contained an abundance of both aluminum atoms and oxygen atoms. This result indicates that aluminum in the aluminum containing oxide layer 118 is in oxidized state.

FIG. 5B illustrates a result of an EDS analysis of the transition metal containing oxide layer 117. As illustrated in FIG. 5B, the transition metal containing oxide layer 117 contained an abundance of both tungsten atoms and oxygen atoms. This result indicates that tungsten in the transition metal containing oxide layer 117 is in oxidized state.

Comparison of Resistance Against Hydrogen

The inventors investigated the resistance of the organic EL element pertaining to implementation example 1 against hydrogen generated during the forming of the lower electrode through the experiment described in the following. In this experiment, the hydrogen resistance of the organic EL element pertaining to implementation example 1 was compared with hydrogen resistance of organic EL elements having lower electrodes formed through processes differing from the process of forming the lower electrode in the manufacturing method of the pertaining to the present aspect.

Figure 6:
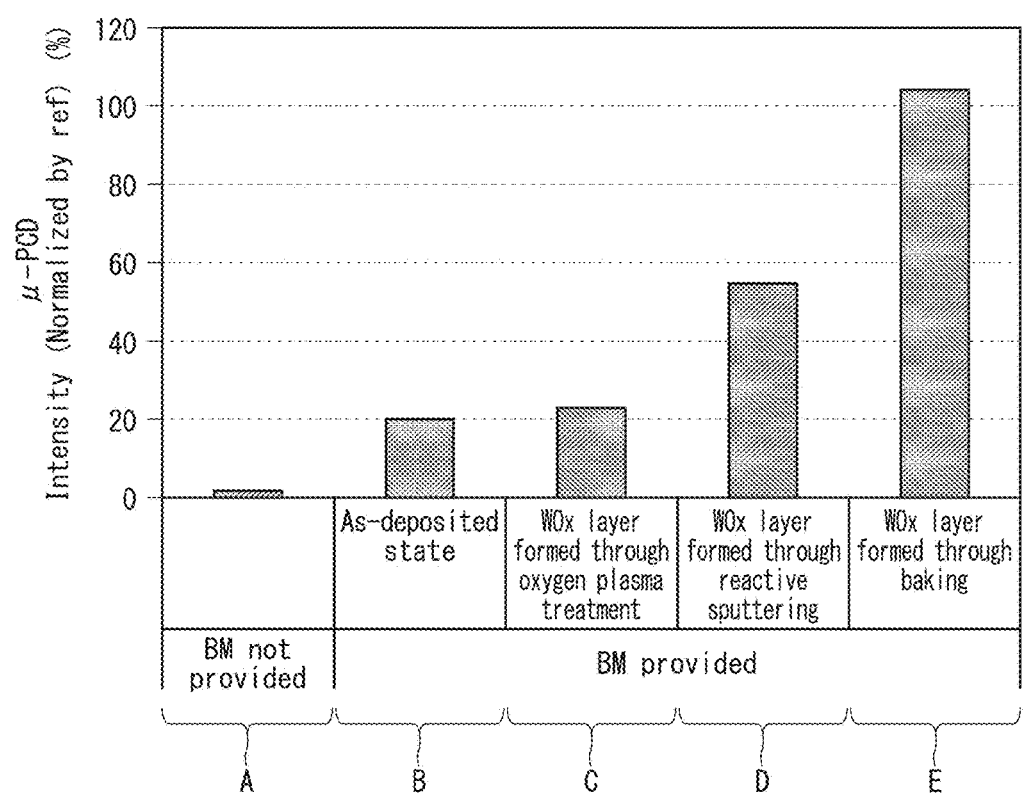
FIG. 6 compares normalized carrier lifetime values for organic EL elements whose lower electrodes were formed through different processes.

FIG. 6 shows normalized carrier lifetime values of TAOS channel layers in organic EL elements whose lower electrodes were formed through different processes. The normalized carrier lifetime values were measured by using the microwave photoconductivity decay method (μ-PCD method). Typically, the longer the carrier lifetime in a TAOS channel layer, the higher the carrier mobility in the TAOS channel layer. Accordingly, the normalized carrier lifetime values measured by using the μ-PCD method, which indicate carrier lifetime in TAOS channel layers, can serve as indicaters of carrier mobility in the TAOS channel layers.

Here, the normalized carrier lifetime values of the TAOS channel layers were calculated by using, as a reference value, a value indicating the carrier lifetime in the TFT substrate 130 before the forming of the lower electrode. A normalized carrier lifetime value of a TAOS channel layer therefore shows the change brought about in carrier mobility in the TAOS channel layer due to the forming of the lower electrode. Note that in order for a TAOS-TFT to function properly even after the forming of the lower electrode, it is preferable that the decrease in carrier mobility in the TAOS channel layer be no greater than 10%. A difference of 10% or smaller is considered as being a measurement error of the μ-PCD method.

The graph indicated by symbol E in FIG. 6 illustrates a normalized carrier lifetime value of the organic EL element pertaining to implementation example 1. In the organic EL element pertaining to implementation example 1, no decrease in carrier mobility in the TAOS channel layer was observed, as the graph indicated by symbol E illustrates. This result confirms that the organic EL element pertaining to implementation example 1 has satisfactory hydrogen resistance. This result further indicates that the aluminum containing oxide layer 118 in the organic EL element pertaining to implementation example 1 has a certain level of density.

The graphs indicated by symbols A-D in FIG. 6 illustrate normalized carrier lifetime values of comparative examples, which are organic EL elements manufactured through manufacturing methods different from the manufacturing method pertaining to the present aspect.

The graph indicated by symbol A illustrates a normalized carrier lifetime value of an organic EL element pertaining to comparative example 1. In the organic EL element pertaining to comparative example 1, the aluminum material layer 119a was directly disposed on the interlayer electrically-insulating layer 115. Accordingly, the lower electrode of the organic EL element pertaining to comparative example 1 only included the aluminum containing metal layer 119. Thus, the organic EL element pertaining to comparative example 1, due to not having the transition metal containing metal layer 116, is indicated as "BM not provided" (BM: barrier metal) in FIG. 6.

In the organic EL element pertaining to comparative example 1, the TAOS channel layer had barely any carrier mobility as the graph indicated by symbol A illustrates. This result confirms that the manufacturing method of directly forming the aluminum material layer 119a, which is made of an Al—Co based alloy, on the interlayer electrically-insulating layer 115 cannot achieve hydrogen resistance.

The graph indicated by symbol B illustrates a normalized carrier lifetime value of an organic EL element pertaining to comparative example 2. The organic EL element pertaining to comparative example 2 was manufactured through the same processes as the organic EL element pertaining to implementation example 1 up to forming of the transition metal material layer 116a. However, comparative example 2 was yielded without performing baking after forming the transition metal material layer 116a through sputtering. Thus, following the forming of the transition metal material layer 116a, the aluminum material layer 119a made of an Al—Co based alloy was directly formed on the transition metal material layer 116a in the as-deposited state. Accordingly, the lower electrode of the organic EL element pertaining to comparative example 2 only included the transition metal containing metal layer 116 and the aluminum containing metal layer 119. Thus, due to having the transition metal containing metal layer 116, comparative example 2 is indicated as "BM provided" in FIG. 6.

In the organic EL element pertaining to comparative example 2, a great decrease in carrier mobility of the TAOS channel layer was observed, as the graph indicated by symbol B illustrates. This result confirms that the manufacturing method of directly forming the aluminum material layer 119a made of an Al—Co based alloy on the transition metal material layer 116a in the as-deposited state cannot achieve satisfactory hydrogen resistance.

The graph indicated by symbol C illustrates a normalized carrier lifetime value of an organic EL element pertaining to comparative example 3. The organic EL element pertaining to comparative example 3 was manufactured through the same processes as the organic EL element pertaining to implementation example 1 up to forming of the transition metal material layer 116a. However, comparative example 3 was yielded without performing baking for forming the transition metal oxide material layer 117a. Instead, the transition metal oxide material layer 117a in comparative example 3 was formed by performing plasma treatment and thereby oxidizing a surface of the transition metal material layer 116a with oxygen plasma. Following the forming of the transition metal oxide material layer 117a, the forming of the lower electrode was performed through the same processes as the forming of the lower electrode in implementation example 1. Accordingly, the lower electrode of the organic EL element pertaining to comparative example 3 was similar to implementation example 1 for including the transition metal containing metal layer 116, the transition metal containing oxide layer 117, the aluminum containing oxide layer 118, and the aluminum containing metal layer 119.

However, in the organic EL element pertaining to comparative example 3, a great decrease in carrier mobility of the TAOS channel layer was observed, as the graph indicated by symbol C illustrates. Specifically, no great difference was observed between the normalized carrier lifetime value of comparative example 3 and the normalized carrier lifetime value of comparative example 2. This result confirms that the manufacturing method of forming the transition metal oxide material layer 117a through plasma treatment cannot achieve satisfactory hydrogen resistance. This result further indicates that the aluminum containing oxide layer 118 formed according to the manufacturing method pertaining to comparative example 3 cannot block hydrogen to a sufficient extent.

The graph indicated by symbol D illustrates a normalized carrier lifetime value of an organic EL element pertaining to comparative example 4. The organic EL element pertaining to comparative example 4 was manufactured through the same processes as the organic EL element pertaining to implementation example 1 up to forming of the transition metal material layer 116a. However, comparative example 3 was yielded without performing baking for forming of the transition metal oxide material layer 117a. Instead, the transition metal oxide material layer 117a in comparative example 3 was formed by performing sputtering (reactive sputtering) using a flat plate made of tungsten as the target material in the presence of oxygen. Following the forming of the transition metal oxide material layer 117a, the lower electrode was formed through the same processes as those for forming the lower electrode in implementation example 1. Accordingly, the organic EL element pertaining to comparative example 4 was similar to the organic EL element pertaining to implementation example 1 for including the transition metal containing metal layer 116, the transition metal containing oxide layer 117, the aluminum containing oxide layer 118, and the aluminum containing metal layer 119.

In the organic EL element pertaining to comparative example 4, the decrease in carrier mobility of the TAOS channel layer was not as great as the decrease in carrier mobility in the TAOS channel layer in comparative example 3, as the graph indicated by symbol D illustrates. However, even with the organic EL element pertaining to comparative example 4, a decrease to 60% or less was observed in the normalized carrier lifetime value, which indicates carrier mobility in the TAOS channel layer. Thus, the TAOS channel layer in comparative example 4 did not have a sufficient level of carrier mobility for ensuring that the TAOS-TFT functions properly. This result thus confirms that the manufacturing method of forming the transition metal oxide material layer 117a through reactive sputtering cannot achieve satisfactory hydrogen resistance. This result further indicates that the aluminum containing oxide layer 118 formed according to the manufacturing method pertaining to comparative example 4 cannot block hydrogen to a sufficient extent.

Density of Transition Metal Containing Oxide Layer 117

The experiment whose results are illustrated in FIG. 6 showed that the second highest level of hydrogen resistance, inferior to only that of implementaton example 1, is achieved when the transition metal oxide material layer 117a is formed through reactive sputtering. In the following, an organic EL element whose transition metal oxide material layer 117a is formed through reactive sputtering is hereinafter referred to as a "reactive sputtering film formation example".

Resistance against hydrogen generated during the forming of the lower electrode is considered to be dependent upon the property of the aluminum containing oxide layer 118 of blocking hydrogen (the property of blocking hydrogen is hereinafter referred to as "hydrogen blocking property"). However, the film forming method of the aluminum oxide material layer 118a, from which the aluminum containing oxide layer 118 is to be formed, did not differ between implementation example 1 and the reactive sputtering film formation example. Further, a flat plate made of tungsten was used as the target material for forming the transition metal material layer 116a in both implementation example 1 and the reactive sputtering film formation example. Meanwhile, implementation example 1 and the reactive sputtering film formation example differred from each other in how the transition metal oxide material layer 117a, which supplies oxygen atoms during the forming of the aluminum oxide material layer 118a, was formed.

In view of the above, the inventors compared implementation example 1 and the reactive sputtering film formation example in terms of the physical properties of the transition metal containing oxide layer 117, which is formed from the transition metal oxide material layer 117a.

Figure 7:
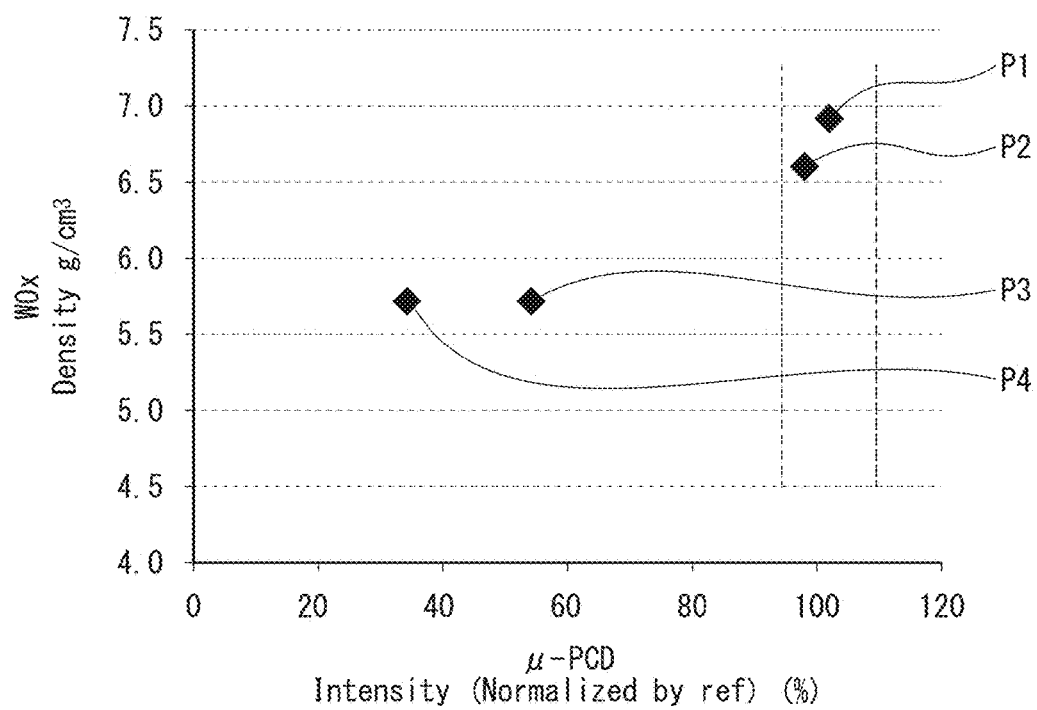
FIG. 7 illustrates a relationship between transition metal containing oxide layer densities and normalized carrier lifetime values.

FIG. 7 illustrates a relationship between different densities of the transition metal containing oxide layer 117 and normalized carrier lifetime values. In FIG. 7, the horizontal axis plots normalized carrier lifetime values, and the vertical axis plots different densities of the transition metal containing oxide layer 117 measured by the X-ray reflectivity method (XRR method).

P1 and P2 in FIG. 7 indicate results of measurement for implementation example 1. At both P1 and P2, the density of the transition metal containing oxide layer 117 was 6.5 g/cm$^3$ or more. Further, neither the normalized carrier lifetime value at P1 nor the normalized carrier lifetime value at P2 indicated a decrease in carrier mobility in the TAOS channel layer.

P3 and P4 in FIG. 7 indicate results of measurement for the reactive sputtering film formation example. At both of P3 and P4, the density of the transition metal containing oxide layer 117 was around 5.7 g/cm$^3$. Further, both the normalized carrier lifetime value at P3 and a normalized carrier lifetime value at P4 indicated a decrease in carrier mobility in the TAOS channel layer. Here, the normalized carrier lifetime value at P3 and the normalized carrier lifetime value at P4, each of which indicating carrier mobility in the TAOS channel layer, indicated a decrease greater than 10%. As described above, a decrease up to 10% is considered as a measurement error of the μ-PCD method.

As described above, the transition metal containing oxide layer 117 had different densities in implementation example 1 and the reactive sputtering film formation example. Further, a decrease in carrier mobility in the TAOS channel layer was observed only with the reactive sputtering film formation example. These results indicate that the difference in densities of the transition metal containing oxide layer 117 between implementation example 1 and the reactive sputtering film formation example brought about the difference in the hydrogen blocking property.

Specifically, the inventors considered that a transmission metal containing oxide layer 117 having a great film density leads to an aluminum containing oxide layer 118 having a greater hydrogen blocking property since with a transmission metal containing oxide layer 117 having a great film density, the aluminum atoms in the aluminum containing oxide layer 118 are oxidized to a greater extent. Specifically, the inventors considered that providing the transition metal containing oxide layer 117 with a density of 6.5 g/cm³ or more is necessary in order to provide the aluminum containing oxide layer 118 with a sufficient hydrogen blocking property, particularly when tungsten is used as the material of the transition metal material layer 116a.

Density of Transition Metal Containing Metal Layer 116

In the baking performed for forming the transition metal oxide material layer 117 in implementation example 1, there is a possibility of a change occurring in the physical property of the transition metal material layer 116a. Based on this, there is a possibility that the difference in hydrogen resistance between implementation example 1 and the reactive sputtering film formation example is brought about by a difference in the physical property of the transition metal material layer 116a between implementation example 1 and the reactive sputtering film formation example. A physical property of the transition metal material layer 116a that may affect hydrogen resistance is the density of the transition metal material layer 116a. In view of this, whether or not the density of the transition metal material layer 116a in implementation example 1 changes between when baking is performed and when baking is not performed was investigated through the following experiment.

Figure 8A:
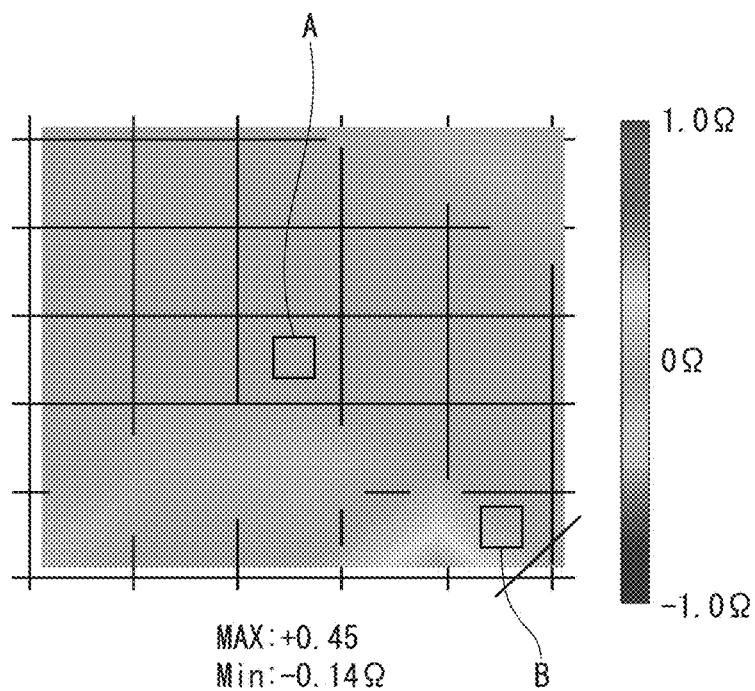
FIG. 8A and FIG. 8B illustrate a change in sheet resistance of the transition metal containing metal layer before and after baking.
Figure 8B:
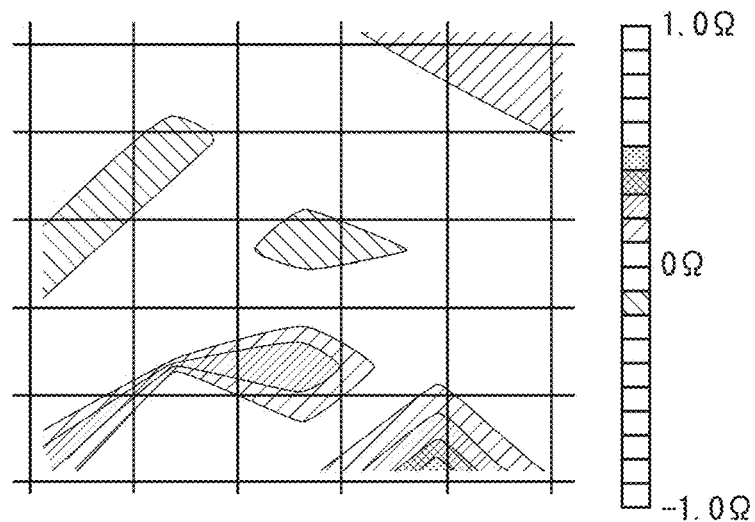

First, sheet resistance at multiple regions of the transition metal material layer 116a was measured. The measurement of sheet resistance was performed before and after the baking. FIG. 8A illustrates contour lines representing differences between the sheet resistance after baking and the sheet resistance before baking at the regions of the transition metal material layer 116a. FIG. 8B is a diagram prepared by tracing contour lines differing from one another by 0.1Ω in FIG. 8A. The difference between the sheet resistance of the transition metal material layer 116a before and after baking was −0.14 Ω where smallest and 0.45Ω where greatest. Further, the sheet resistance of the transition metal material layer 116a before baking was substantially between 6 Ω and 7Ω. Accordingly, the change in sheet resistance before and after baking was no greater than 10%.

Typically, the greater the film density, the smaller the sheet resistance. However, a trend such that sheet resistance decreases after baking over the entirety of the transition metal material layer 116a was not observed in this experiment. Thus, according to the results of measurement of sheet resistance, it can be considered that the baking does not bring about a great increase in film density over the entirety of the transition metal material layer 116a.

Further, the density of the transition metal material layer 116a was also measured by using the XRR method. The measurement of density was performed before and after baking, at two regions of the transition metal material layer 116a indicated by symbol A and symbol B in FIG. 8A. The density of the region indicated by symbol A was 18.68 g/cm³ before baking and 18.9 g/cm³ after baking, which means that the baking brought about an increase in density of 0.22 g/cm³. The density of the region indicated by symbol B was 18.96 g/cm³ before baking and 18.8 g/cm³ after baking, which means that the baking brought about a decrease in density of 0.16 g/cm³. Thus, the results of measurement using the XRR method also did not indicate a trend such that the film density is greater after baking over the entirety of the transition metal material layer 116a.

As described above, neither the measurement of sheet resistance nor the measurement using the XRR method indicated that the baking increases the density of the transition metal material layer 116a. Accordingly, it can be considered that the baking does not improve the hydrogen blocking property of the transition metal material layer 116a. This indicates that the difference in hydrogen resistance between implementation example 1 and the reactive sputtering film formation example was not due to an increase in the density of the transition metal material layer 116a caused by baking.

Accordingly, the difference in hydrogen resistance between implementation example 1 and the reactive sputtering film formation example is considered to be due to a difference in the degree of oxidation of aluminum atoms in the aluminum oxide material layer 118a.

Sputtering Power in Forming of Transition Metal Material Layer 116a

The inventors investigated how sputtering power in the forming of the transition metal material layer 116a affects hydrogen resistance of the organic EL element pertaining to implementation example 1.

Figure 9:
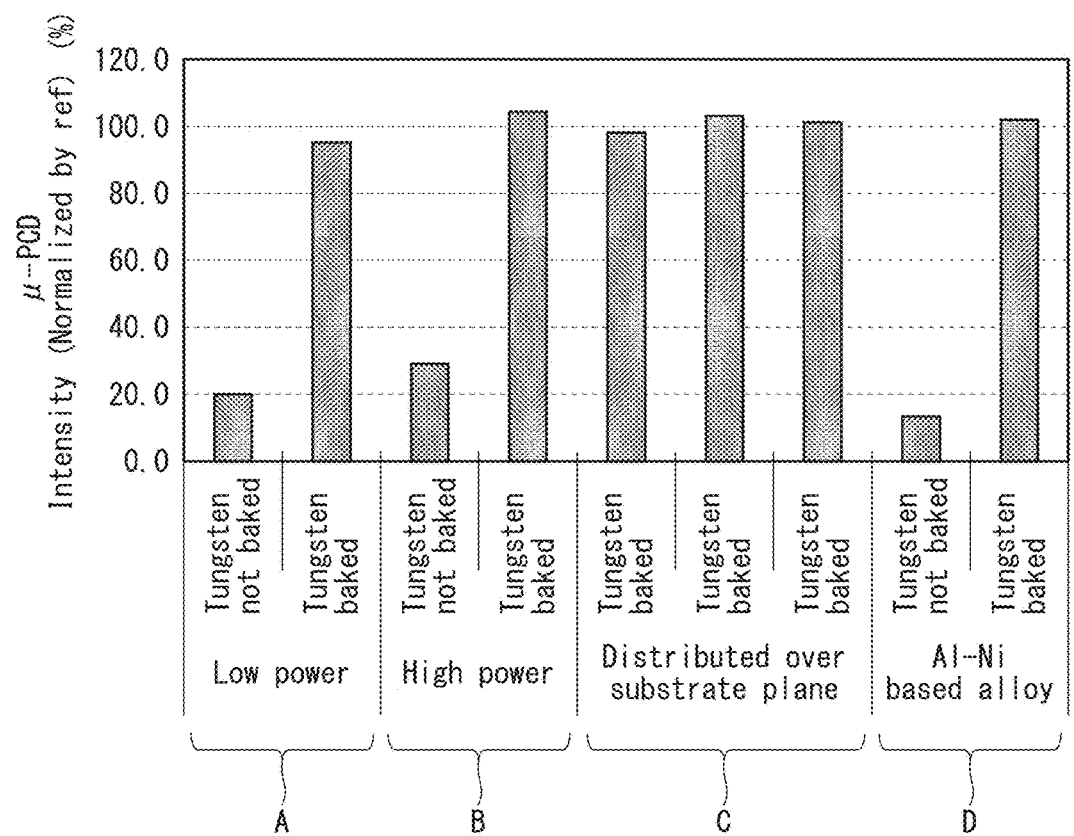
FIG. 9 illustrates normalized carrier lifetime values.

The graphs indicated by symbol A in FIG. 9 illustrate normalized carrier lifetime values when the transition metal material layer 116a was formed through low-power sputtering. The graphs indicated by symbol B in FIG. 9 illustrate normalized carrier lifetime values when the transition metal material layer 116a was formed through high-power sputtering. Among the pair of graphs for each of symbol A and symbol B, the graph on the left corresponds to an organic EL element including an unbaked transition metal material layer 116a, and the graph on the right corresponds to an organic EL element including a baked transition metal material layer 116a, i.e. implementation example 1.

Carrier mobility in the TAOS channel layer for the organic EL element including an unbaked transition metal material layer 116a formed through low-power sputtering (indicated by symbol A) indicated a decrease to around 20%. Meanwhile, carrier mobility for the organic EL element including an unbaked transition metal material layer 116a formed through high-power sputtering (indicated by symbol B) indicated a decrease to around 30%.

However, carrier mobility for the organic EL element pertaining to implementation example 1, regardless of whether the transition metal material layer 116a was formed through low-power sputtering (symbol A) or high-power sputtering (symbol B), indicated only a decrease within the 10% error range of the μ-PCD method.

That is, irrespective of the difference in sputtering power used for forming the transition metal material layer 116a, the trend between the normalized carrier lifetime values corresponding to when baking of the transition metal material layer 116a was performed was similar to the trend between the normalized carrier lifetime values corresponding to when baking of the transition metal material layer 116a was not performed. This result indicates that the hydrogen resistance of the organic EL element pertaining to implementation example 1 is not dependent upon sputtering power in the forming of the transition metal material layer 116a.

In reality, it can be assumed that a difference in sputtering power brings about a difference in the density of the transition metal material layer 116a. However, the transition metal material layer 116a does not block hydrogen as much as the aluminum oxide material layer 118a blocks hydrogen. Accordingly, it can be regarded that an organic EL element can be provided with a necessary level of hydrogen resistance as long as aluminum atoms in the aluminum oxide material layer 118a are sufficiently oxidized, irrespective of such difference in density of the transition metal material layer 116a.

Dependency of Hydrogen Resistance on Location

The inventors investigated whether or not the hydrogen resistance of the organic EL element pertaining to implementation example 1 differs depending upon location through the following experiment. In this experiment, the inventors formed a plurality of organic EL elements on a substrate, and conducted measurement using the μ-PCD method on three organic EL elements among the organic EL elements formed. Specifically, the three organic EL elements were formed at different regions, including a central portion of the substrate plane and an end portion of the substrate plane. Three graphs indicated by symbol C in FIG. 9 indicate the normalized carrier lifetime values of the three organic EL elements. As illustrated in FIG. 9, a decrease in carrier mobility was not observed in any of the three regions. This result indicates that the hydrogen resistance of the organic EL element pertaining to implementation example 1 is not dependent upon location.

Accordingly, by applying the manufacturing method pertaining to the present aspect to the manufacturing of a large-sized display and the like including TAOS-TFTs formed over a wide substrate area, it can be ensured that a decrease in carrier mobility in each of such TAOS-TFTs is not caused by hydrogen.

Material for Aluminum Oxide Material Layer 118a

The inventors investigated whether or not a change in target material used in the forming of the aluminum oxide material layer 118a affects hydrogen resistance of an organic EL element.

Among the graphs indicated by symbol D in FIG. 9, the graph on the left indicates the normalized carrier lifetime value of the organic EL element pertaining to comparative example 5, and the graph on the right indicates a normalized carrier lifetime value of an organic EL element pertaining to implementation example 2.

The organic EL element pertaining to comparative example 5 was formed through the same processes as the organic EL element pertaining to implementation example 1 up to forming of the transition metal material layer 116a. However, comparative example 5 was yielded without performing baking after forming the transition metal material layer 116a through sputtering. Following the forming of the transition metal material layer 116a, the aluminum material layer 119a was directly formed on the transition metal material layer 116a in the as-deposited state through sputtering. In this sputtering, a flat plate made of an Al—Ni based alloy was used as the target material instead of the flat plate made of an Al—Co based alloy used for forming the aluminum material later 119a in implementation example 1. Accordingly, the lower electrode of the organic EL element pertaining to comparative example 5 only included the transition metal containing metal layer 116 and the aluminum containing metal layer 119.

The organic EL element pertaining to implementation example 2 was manufactured through the same processes as the organic EL element pertaining to implementation example 1 up to the forming of the transition metal oxide material layer 117a. However, a flat plate made of an Al—Ni based alloy was used as the target material in the sputtering for forming the aluminum oxide material layer 118a and the aluminum material layer 119a, which is similar to how the aluminum material layer 119a of comparative example 5 was formed. Other processes for forming the lower electrode of implementation example 2 were the same as those for forming the lower electrode of implementation example 1. Accordingly, the lower electrode of the organic EL element pertaining to implementation example 2 included the transition metal containing metal layer 116, the transition metal containing oxide layer 117, the aluminum containing oxide layer 118, and the aluminum containing metal layer 119, similarly to the organic EL element pertaining to implementation example 1.

Through this experiment, a decrease in carrier mobility in the TAOS channel layer was observed in comparative example 5. This result indicates that hydrogen is generated during the baking of the aluminum material layer 119a, even when the aluminum material layer 119a is made of an Al—Ni based alloy and not an Al—Co based alloy.

However, a decrease in carrier mobility in the TAOS channel layer was not observed in implementation example 2. This indicates that the aluminum containing oxide layer 118 in implementation example 2 is dense and has a satisfactory hydrogen blocking property.

As such, it can be considered that the manufacturing method pertaining to the present aspect achieves satisfactory resistance against hydrogen generated during the forming of the lower electrode even when an Al—Ni based alloy is used.

Consideration of Conditions in Reactive Sputtering Film Formation Example

The inventors considered preferable conditions for providing the reactive sputtering film formation example with improved hydrogen resistance.

Influence of Power in Reactive Sputtering on Hydrogen Resistance

Figure 10A:
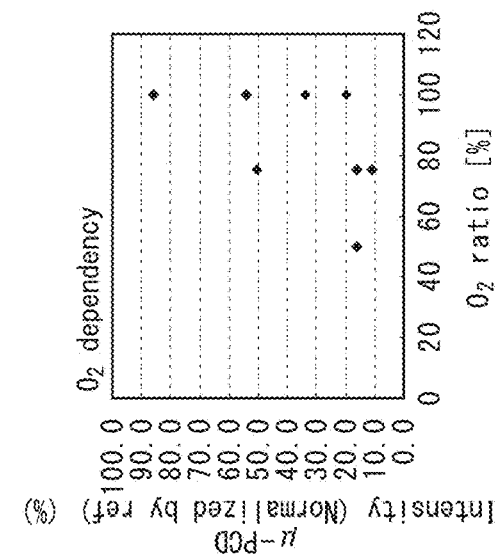
FIG. 10A, FIG. 10B, and FIG. 10C compare normalized carrier lifetime values for different conditions applied in forming the transition metal containing oxide layer through reactive sputtering.

In FIG. 10A, the horizontal axis plots sputtering power levels in reactive sputtering for forming the transition metal oxide material layer 117a, and the vertical axis plots normalized carrier lifetime values. As illustrated in FIG. 10A, the decrease in carrier mobility in the TAOS channel layer tended to be small for high sputtering power levels in the reactive sputtering.

Influence of Gas Pressure on Hydrogen Resistance

The transition metal oxide material layer 117a serves as a source of oxygen atoms in the forming of the aluminum oxide material layer 118a. Accordingly, providing the transition metal oxide material layer 117a with a greater density and a higher oxidation degree is expected to be more advantageous for providing the aluminum oxide material layer 118a with a high hydrogen blocking property.

Here, the higher the gas pressure in reactive sputtering for forming the transition metal oxide material layer 117a, the higher the oxidation degree of the transition metal oxide material layer 117a. This is because, in typical reactive sputtering, the higher the gas pressure, the longer the mean free path of sputter particles. Meanwhile, the higher the gas pressure, the smaller the density of the transition metal oxide material layer 117a. This is considered to be due to the following: a large number of argon molecules in the inert gas mixes into a film when gas pressure in reactive sputtering for forming the film is high, and sputter particles have low energy because the sputter particles hit the argon molecules contained in the film.

Accordingly, the transition metal oxide material layer 117a, when formed under high pressure, has a small density while having a high oxidation degree. Meanwhile, the transition metal oxide material layer 117a, when formed under low pressure, has a low oxidation degree while having a great density. It is therefore impossible to achieve both a great density and a high oxidation degree of the transition metal oxide material layer 117a by adjusting gas pressure in reactive sputtering.

Figure 10B:
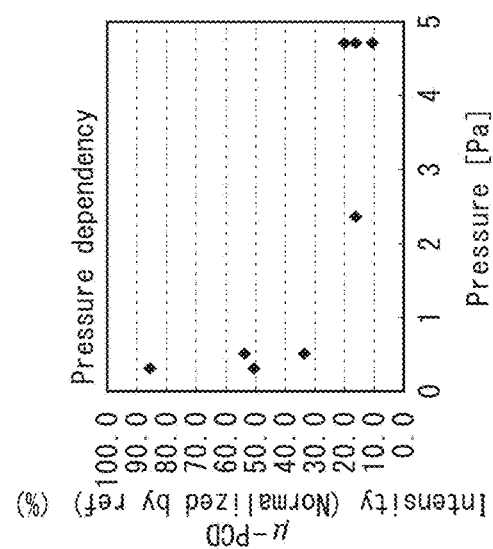

In FIG. 10B, the horizontal axis plots different gas pressure levels in the reactive sputtering for forming the transition metal oxide material layer 117a, and the vertical axis plots normalized carrier lifetime values. As illustrated in FIG. 10B, the decrease in carrier mobility in the TAOS channel layer tended to be small when gas pressure was high in reactive sputtering.

Influence of Oxygen Ratio on Hydrogen Resistance

Figure 10C:
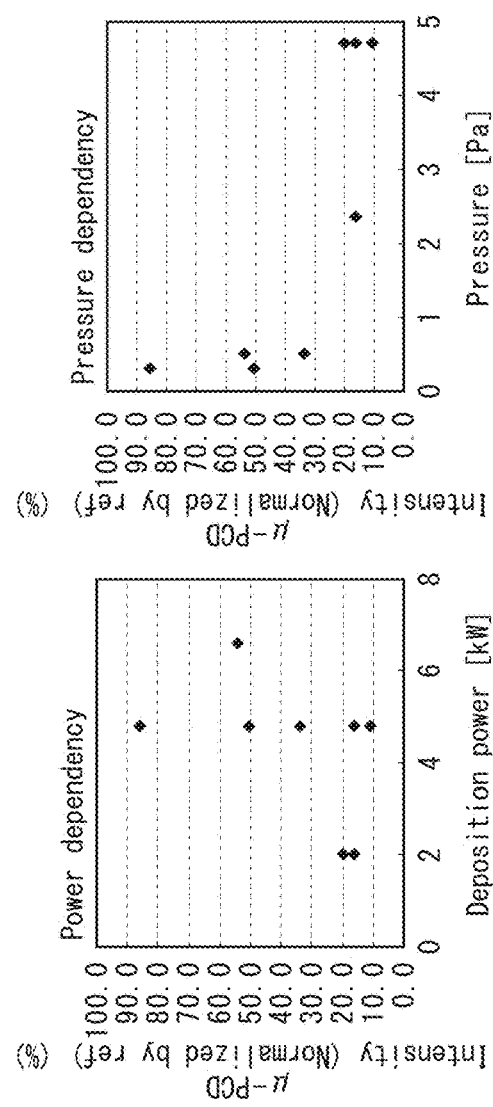

In FIG. 10C, the horizontal axis plots different oxygen ratios in the reactive sputtering for forming the transition metal oxide material layer 117a, and the vertical axis plots normalized carrier lifetime values. As illustrated in FIG. 10C, the decrease in carrier mobility in the TAOS channel layer tended to be small with high oxygen ratio. This is considered to owe to the fact that the greater the oxygen ratio, the higher the oxidation degree.

From the above-described experiments, the inventors consider it preferable that the reactive sputtering be performed with high energy, low pressure, and high oxygen ratio in order to provide the reactive sputtering film formation example with high hydrogen resistance.

INDUSTRIAL APPLICABILITY

For example, the present invention is usable as organic EL elements used as display devices for, for example, televisions and mobile phone displays, and is also usable as a manufacturing method of such organic EL elements. Specifically, the present invention is expected to achieve an organic EL element that has excellent image display performance due to including a TAOS-TFT as a driving transistor.

REFERENCE SIGNS LIST 101 substrate
102, 103 gate electrode
104 gate insulating layer
105, 106 TAOS channel layer
107 channel protection layer
108, 110 drain electrode
109, 111 source electrode
112 lower passivation layer
113 connection electrode
114 upper passivation layer
115 interlayer electrically-insulating layer
115a contact hole
116 transition metal containing metal layer
116a transition metal material layer
117 transition metal containing oxide layer
117a transition metal oxide material layer
118 aluminum containing oxide layer
118a aluminum oxide material layer
119 aluminum containing metal layer
119a aluminum material layer
120 lower electrode
121 organic light-emitting layer
122 upper electrode
123 sealing layer
124 bank
130 TFT substrate
140 organic EL unit

The invention claimed is:

1. An organic electroluminescence (EL) element comprising:
a substrate including a thin film transistor (TFT); and
an organic EL unit including a light-emitting layer having a bottom surface and an electrode electrically connected to the TFT, wherein
the TFT has a channel layer made of a transparent amorphous oxide semiconductor (TAOS),
the electrode is a stack of a plurality of layers disposed on the substrate,
the plurality of layers include:
a metal layer made of aluminum or an alloy containing aluminum;
a first oxide layer closer to the substrate than the metal layer; and
a second oxide layer disposed between the metal layer and the first oxide layer and in contact with both the metal layer and the first oxide layer,
the second oxide layer contains an oxide of aluminum,
the first oxide layer contains an oxide of a transition metal, and
wherein
the metal layer is in direct contact with the bottom surface of the light-emitting layer.

2. The organic EL element of claim 1, wherein
the transition metal is tungsten, and
a density of the first oxide layer is 6.5 g/cm$^3$ or more.

* * * * *